(12) United States Patent
Green

(10) Patent No.: US 6,320,316 B1
(45) Date of Patent: Nov. 20, 2001

(54) APPARATUS FOR COUPLING POWER INTO A BODY OF GAS

(75) Inventor: Ian Macdonald Green, London (GB)

(73) Assignee: Central Research Laboratories, Limited, Hayes (GB)

( * ) Notice: Subject to any disclaimer, the term of this patent is extended or adjusted under 35 U.S.C. 154(b) by 0 days.

(21) Appl. No.: 09/700,413

(22) PCT Filed: May 19, 1999

(86) PCT No.: PCT/GB99/01592

§ 371 Date: Nov. 19, 2000

§ 102(e) Date: Nov. 19, 2000

(87) PCT Pub. No.: WO99/62308

PCT Pub. Date: Dec. 2, 1999

(51) Int. Cl.[7] .................................................. H01J 61/00
(52) U.S. Cl. ............................ 315/39; 315/248; 315/344
(58) Field of Search ........................... 315/248, 39, 344, 315/40, 242; 313/161, 484

(56) References Cited

U.S. PATENT DOCUMENTS

| 4,710,678 | * | 12/1987 | Houkes et al. ........................ 315/39 |
| 4,918,031 | * | 4/1990 | Flamm et al. ........................ 437/225 |
| 5,726,523 | * | 3/1998 | Popov et al. ........................ 313/161 |

FOREIGN PATENT DOCUMENTS

| 0790635-A2 | * | 8/1997 | (EP) . |
| 10149898 | | 6/1998 | (JP) . |

* cited by examiner

*Primary Examiner*—David Vu
(74) *Attorney, Agent, or Firm*—William H. Bollman

(57) ABSTRACT

Apparatus for coupling power into a body of gas by induction to provide a gas discharge, comprises a source of a/c power (3) coupled to a circuit arrangement having an inductor comprising two coils (1, 2), each constituted by a respective elongate conductor, the conductors each having one end coupled to the circuit arrangement at opposite respective sides of the inductor, and having the other end at a floating potential. The mutual capacitance between the coils, together with the inductance of the inductor as a whole, constitute a balanced self-resonant circuit having a resonant frequency which is greater than 1 MHz and less than 100 MHz. This arrangement can reduce temperature variations in the resonant frequency and can reduce unwanted r.f. emissions.

6 Claims, 1 Drawing Sheet

APPARATUS FOR COUPLING POWER INTO A BODY OF GAS

BACKGROUND OF THE INVENTION

1. Field of the Invention

This invention relates to apparatus for coupling power into a body of gas by induction to provide a gas discharge, comprising a source of a/c power coupled to a circuit arrangement having an inductor comprising a plurality of turns of a conductor surrounding a space having a body of gas. It relates particularly, though not exclusively, to coupling of a/c power at radio frequencies.

2. Background

Radio frequency gas discharges are used in a variety of technical fields such as lighting and thin film deposition and etching. Drive circuits for such gas discharges normally have a coupling inductor as part of a series tuned circuit including a series capacitor. The circuit is driven at its resonant frequency to produce the high voltage required to strike the discharge. After striking the discharge, current in the inductor couples into the conducting gas plasma by transformer action (i.e. inductively), the plasma thus loading the resonant circuit and reducing the resonant voltage.

The series capacitor which is used in such drive circuits to complete the tuned circuit introduces several drawbacks. For example, to strike the gas discharge or plasma, high voltages such as, for example, several thousand volts may be encountered. Low cost capacitors have a significant temperature dependence at such voltages, which can cause the resonant frequency to change. The placement of the capacitor can be problematical because of the danger of breakdown of the printed circuit board. In addition, the resonant node on the side of the capacitor connected to the coil constitutes a "hot" end to the coil, increasing the problem of r.f. radiation in operation.

A known apparatus for coupling power into a body of gas and minimising the problem of r.f. radiation is disclosed in U.S. Pat. No. 5,525,871

SUMMARY OF THE INVENTION

According to the present invention, there is provided apparatus as defined in claims 1–4. This arrangement avoids the problems associated with a separate series capacitor by using the mutual capacitance between two adjacent coils, and can minimise unwanted r.f. radiated energy.

BRIEF DESCRIPTION OF THE DRAWINGS

Embodiment of the invention will now be described, by way of example only, with reference to the accompanying diagrammatic drawings, in which.

DETAILED DESCRIPTION OF ILLUSTRATIVE EMBODIMENT

Figure 1:
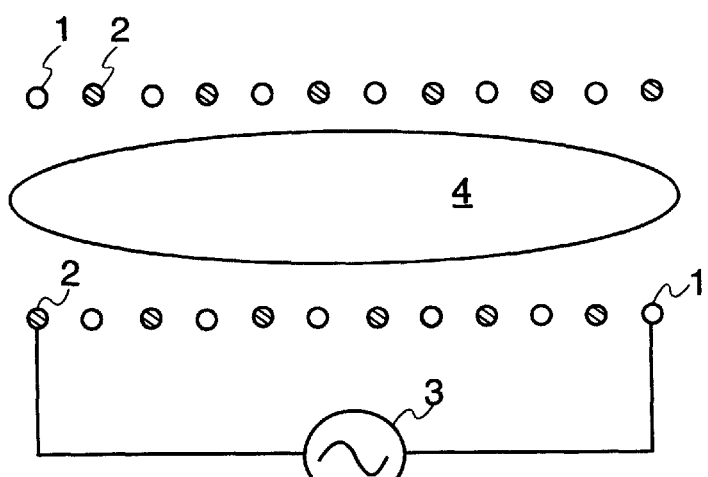
FIG. 1 shows a cross section of a first inductor according to the invention.

FIG. 1 shows a cross section through a first embodiment of the invention. The inductor is made up of a first coil (1) and a second coil (2), the windings being interleaved to form a bifilar resonant circuit. The separate wires forming the two coils are shown as having a different pattern of hatching in the Figure. The circuit also comprises a source of a/c power (3), and the Figure also shows a body of a gas (4) in which a gas discharge is maintained by inductive coupling from the coils. The inductive component of the resonant circuit is either the inductance of the first or the second coil, even although one end of each is unconnected to anything, and thus at a floating potential. The capacitive component of the resonant circuit is formed from the distributed interwinding capacitances between the first coil and the second coil. This capacitance is in general not a strong function of temperature.

In use, the r.f. current entering the first coil flows partly along the first coil and partly via interwinding capacitance to the second coil in such a way that by the far end (floating end) of the first coil all the current has transferred to the second coil, the current thus exiting via the non-floating end of the second coil.

High resonant voltages are developed at the unconnected (floating) ends of the two coils, which should be insulated. The voltages at the two floating ends of the coils are in anti-phase, thus reducing unwanted r.f. emissions if the ends are located close to one another, in comparison with the unbalanced conventional arrangement having an external capacitor.

A number of different practical winding arrangements can give an interwinding capacitance which varies less with temperature than low cost external capacitors.

Figure 2:
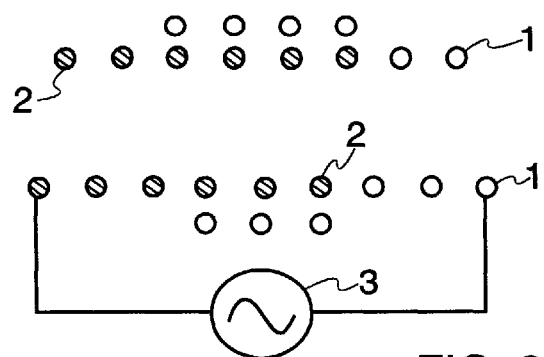
FIG. 2 shows a cross section of a second inductor according to the invention.
Figure 3:
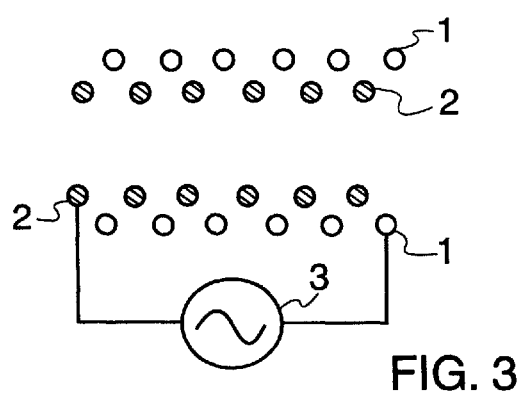
FIG. 3 shows a cross-section of a third inductor according to the invention

Concomitant with the provision of a resonant circuit having a suitable resonant frequency, the coils/windings must provide an electric field suitable for striking the plasma, and an inductive field suitable for efficient inductive coupling to the gas plasma. FIGS. 2 and 3 show two further embodiments of windings in accordance with the present invention which give significantly different electric field profiles compared with the arrangement shown in FIG. 1. These arrangements may be advantageous for starting (striking) the discharge.

Examples of the arrangement shown in FIG. 1 have been constructed by winding 12 turns of PTFE coated wire 0.25 mm in thickness for each of the two coils directly onto a transparent glass envelope 28 mm in diameter containing neon for use as an electrodeless lamp. In this example the resonant frequency was 10.9 MHz, and the inter winding capacitance was of the order of 50 pF. It is anticipated that inductors having a suitable inter coil capacitance will be capable of being constructed for operation at resonant frequencies between approximately 1 and 100 MHz.

The coils preferably comprise a bifilar winding, the two coils acting as a single RF coupler in use, with one end of each coil being left open circuit. An advantage of such an arrangement is that electrostatic damage caused by the build up of electrical fields on insulative parts of the apparatus in use is minimised.

What is claimed is:

1. Apparatus for coupling power into a body of gas by induction to provide a gas discharge, comprising:
   an input for a/c power coupled to an inductor comprising a plurality of turns of a conductor surrounding a space having a body of gas, the inductor comprising two coils, each of the two coils comprising a respective elongate conductor;

wherein the two coils each has one end coupled to the input for a/c power at either side of the inductor, and each has the other end at a floating potential.

2. Apparatus as claimed in claim 1, wherein:

a mutual capacitance between the two coils, and an inductance of the inductor as a whole, comprise a balanced self-resonant circuit.

3. Apparatus as claimed in claim 1 or claim 2, wherein:

a frequency of a/c power input to the input for a/c power is greater than 1 MHz and less than 100 MHz.

4. Apparatus as claimed in claim 1, wherein:

the two coils are arranged to comprise a bifilar winding.

5. Apparatus as claimed in any preceding claim, wherein:

the apparatus is included in a drive circuit of an electrodeless lamp.

6. Apparatus as claimed in claim 1, further comprising:

an a/c power source coupled to said input for a/c power.

* * * * *